United States Patent [19]

Brooks

[11] 4,388,595

[45] Jun. 14, 1983

[54] APPARATUS AND METHOD FOR REMOVING BIAS DISTORTION FROM A PRODUCT DEMODULATOR

[75] Inventor: Grant P. Brooks, Randolph, N.J.

[73] Assignee: Bell Telephone Laboratories, Incorporated, Murray Hill, N.J.

[21] Appl. No.: 247,800

[22] Filed: Mar. 26, 1981

[51] Int. Cl.³ .................... H03D 3/06; H03K 9/00; H04L 27/14

[52] U.S. Cl. .................... 329/104; 328/55; 328/155; 328/160; 329/126; 329/145; 375/80; 375/88; 375/94

[58] Field of Search .............. 329/104, 106, 107, 110, 329/122, 145, 126–128, 137; 328/55, 56, 58, 162, 135, 155, 158, 160; 307/603, 519; 375/80, 83–91, 94, 96; 455/214, 337

[56] References Cited

U.S. PATENT DOCUMENTS

| | | | |
|---|---|---|---|
| 3,387,220 | 6/1968 | Lender | 329/104 |
| 3,764,927 | 10/1973 | Allinger et al. | 329/104 |
| 3,778,727 | 12/1973 | Williams | 329/104 |
| 4,048,572 | 9/1977 | Dogliotti et al. | 329/104 |
| 4,054,840 | 10/1977 | Sato | 329/145 X |

OTHER PUBLICATIONS

Oppenheim, "Applications of Digital Signal Processing", Prentice-Hall, Inc., 1978, pp. 1–17.

*Primary Examiner*—Siegfried H. Grimm
*Attorney, Agent, or Firm*—M. A. Morra

[57] ABSTRACT

A class of product demodulators operates by multiplying an input signal with a delayed version of itself. Bias distortion in such product demodulators arises when the signals to be multiplied together are not separated by the correct amount of delay. The amount of delay may be adjusted by additively combining a portion of the incoming signal with the delayed signal. In one embodiment an analog implementation is disclosed having a linear multiplier, adder, and delay line. In another embodiment a digital signal processor is utilized to perform product demodulation in accordance with the invention when periodic samples of the incoming waveform are the available signal.

10 Claims, 4 Drawing Figures

APPARATUS AND METHOD FOR REMOVING BIAS DISTORTION FROM A PRODUCT DEMODULATOR

FIELD OF THE INVENTION

This invention relates generally to circuits for regulating phase and delay characteristics of a sinusoidal waveform and more particularly to product demodulators for frequency shift keyed waveforms.

BACKGROUND OF THE INVENTION

Product modulation is a correlation technique, widely used in both (transmitter) modulation and (receiver) demodulation circuitry. In this technique, a first signal waveform is multiplied with a second signal waveform and the resulting signal is then filtered to remove unwanted energy. Such a system is illustrated in U.S. Pat. No. 3,387,220 issued on June 4, 1968 to A. Lender. In a transmitter the first signal waveform advantageously comprises a carrier wave and the second signal waveform comprises a modulating signal. In a receiver the first signal is an incoming modulated signal and the second is a local reference against which the first signal is compared. One known reference signal is a pure tone whose phase and frequency are carefully regulated. Another known reference signal is a delayed version of the first signal which is useful in making a differential comparison. The latter has the advantage of not having to be carefully regulated in phase and amplitude as was the pure reference tone.

When the delayed version of the first signal is used as the second signal it is important to carefully control the value of the delay. In an example case of detecting a frequency modulated signal, an interval of delay is selected such that at a particular frequency $f_c$ the delay is equivalent to a 90 degree phase shift. When the input signal at frequency $f_c$ is multiplied with that same frequency phase shifted by 90 degrees, the resulting output signal has a net dc value of zero volts. Frequencies above or below $f_c$ will have a net negative or positive value and are readily detected by simple filtering and polarity detection. When, however, the delay is such that at $f_c$ a 90 degree phase shift is not achieved, then when the multiplication is performed the resulting output signal will not have a zero volt net dc value. This dc offset is known as bias distortion and causes degraded performance. Furthermore, the effects of additive noise are increased when the phase shift at the central frequency is other than 90 degrees.

Conventional methods for compensating delay (phase shift) teach the insertion of a filter section having a particular delay at the frequency of interest. This method involves size and cost increases in the receiver and is shown in FIG. 1.9 of *Applications of Digital Signal Processing*, edited by Alan V. Oppenheim, copyright 1978 by Prentice-Hall Inc.

It is therefore an object of this invention to minimize bias distortion in correlation detectors without a substantial size and cost penalty for compensation apparatus.

It is another object of this invention to provide a delay compensation technique that is readily adapted to sampled data systems.

SUMMARY OF THE INVENTION

In accordance with this invention a compensated delay signal is provided by additively combining a portion of the first signal with a delayed version of itself. The resulting signal, thus compensated, is then multiplied in a conventional manner with the incoming signal to achieve product demodulation with minimum bias distortion.

In one embodiment of the invention an incoming signal is subject to a fixed delay and a portion of the incoming signal is linearly added to the delayed signal in order to form a delay compensated signal. This signal is thereafter multiplied with the incoming signal to produce a product modulated signal having minimum bias distortion.

In another embodiment of the invention, periodic samples of the incoming signal are converted into a plurality of binary digits and are digitally processed thereafter. Instructions, stored in memory, set up the processing steps of addition and multiplication in a predetermined sequence.

DETAILED DESCRIPTION

Figure 1:
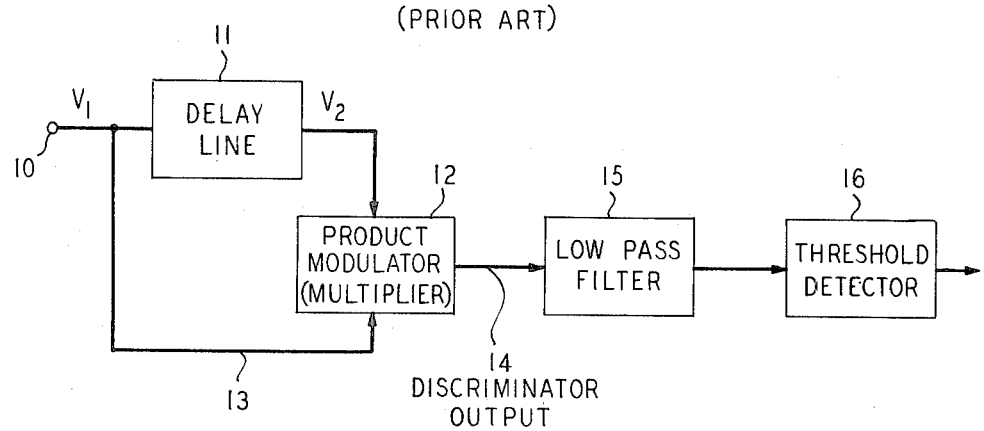
FIG. 1 illustrates a prior art product demodulation system.

Product demodulation is readily understood by considering the prior art circuit of FIG. 1. In this figure, a modulated input signal $V_1$ at terminal 10 is to be multiplied with itself, after suitable delay, in product modulator 12. The input signal is correlated with itself at two points in time separated by $T_0$ seconds. $T_0$ seconds of delay is provided by delay line 11. The output of product modulator 12 contains a dc voltage component that can be used to determine what the modulating signal was.

As an example, assume that a binary frequency shift keyed (FSK) signal is transmitted having a mark frequency of 1800 Hz and a space frequency of 2200 Hz. When the delay line is arranged to provide 90 degrees of phase shift at 2000 Hz, the output of the product modulator will be a signal having a net dc value of zero volts at 2000 Hz since:

$$\sin \omega_0 t \cdot \cos \omega_0 t = \tfrac{1}{2} \sin 2\omega_0 t$$

At 2000 Hz, a 90 degree phase shift corresponds to 125 microseconds of delay. As long as the selected frequencies and the available delay remain unchanged, the dc output at this center frequency will be zero volts.

Perturbations around 2000 Hz cause the resulting dc voltage on line 14 to vary in a positive or negative fashion. A frequency of 2200 Hz exhibits a net negative voltage while a frequency of 1800 Hz exhibits a net positive voltage. Decoding is therefore simply achieved by measuring the averaged (filtered) polarity of the product demodulated signal. The task of filtering (Low Pass Filter 15) is facilitated by the fact that product demodulation generates frequencies at twice the frequency of the incoming signal thereby separating the distance (in frequency) between the dc level to be detected and the signal variations to be ignored. This feature, among others, makes product demodulation a desirable detection scheme.

Applying this detection scheme to sampled data systems whereby only periodic samples of an incoming signal are available, it is possible to utilize product demodulation in two known ways:

(1) Reconstruct the incoming signal from the available samples in accordance with Nyquist filtering criteria. This technique requires filters plus a conventional demodulator such as illustrated by FIG. 1.

(2) Utilize digital signal processing directly when the sampling rate generates samples that are separated by a time interval equal to the optimum delay. In the above mentioned example the sampling rate would have to be 8000 samples per second.

Note that the second technique has samples every 125 microseconds and therefore product demodulation is achieved simply by multiplying adjacent samples. The correct delay is fortunately built right into the sampling rate. It may be, however, that the given sampling rate is not at 8000 samples per second and the incoming frequencies cannot be changed to accommodate this different sampling rate. It would now seem that digital signal processing is precluded or at least substantially hindered.

The invention teaches a technique for getting around this problem. It is applicable to linear demodulators and to sampled data systems. The former is considered first.

Figure 2:
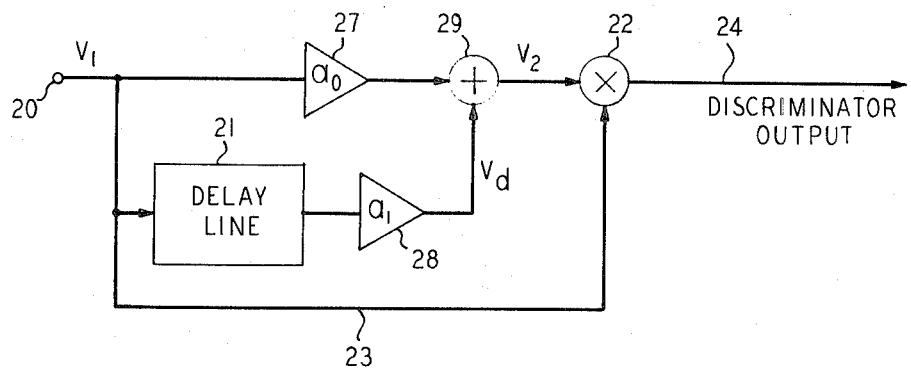
FIG. 2 discloses a linear circuit for a product demodulator in accordance with this invention.

FIG. 2 illustrates the invention in basic terms. Input signal $V_1$ at terminal 20 is sinusoidal and may, for example, be at one of two possible frequencies. Its amplitude is scaled by device 27 having gain $a_0$. When the delayed version of the input signal is generated by delay line 21, its amplitude is similarly scaled by device 28 having gain $a_1$. Summing circuit 29 additively combines these two signals to form signal $V_2$, also referred to as the delay compensated signal. The amount of compensation is controlled by coefficients $a_0$ and $a_1$ either of which may be unity. Further, these coefficients may be positive or negative numbers. Naturally, compensation is not required when the delay available in delay line 21 is optimum, but this is not always the case. Furthermore, gain coefficients are generally more adaptable to change than a delay line thereby allowing one basic structure to be readily modified in order to handle a number of different FSK frequencies.

Figure 3:
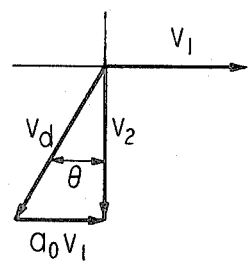
FIG. 3 is a vector diagram illustrating the nature of the correction being made by the invention.

The vector diagram of FIG. 3 represents sine waves as rotating vectors. At some predetermined frequency the signals $V_1$ and $V_2$ are required to be 90 degrees out of phase for optimum results. The delayed signal (vector $V_d$) is modified by the addition of a portion of the incoming signal (vector $a_0V_1$) to form the delay compensated signal $V_2$.

An illustrative sampling rate for the incoming signal is 7200 times per second (every 138 microseconds); example frequencies are 2025 Hz and 2225 Hz. The coefficients $a_0$ and $a_1$ are chosen such that the phase shift at the center frequency ($f_c$=2125 Hz) is 90 degrees. Note that a delay of 138 microseconds is equivalent to 127 degrees of phase shift at $f_c$. Referring again to FIG. 3, vector $V_d$ is equivalent to $a_1V_1$ in magnitude and the angle $\theta$ is equal to 37 degrees. From basic trigonometric considerations, the following equation can be written by inspection:

$$\sin \theta = a_0V_1/a_1V_1 = a_0/a_1$$

The correction to be made is therefore a function of the ratio of coefficients and is expressed as:

$$a_0/a_1 = \sin 37° = 0.6018$$

This means that sixty percent of each incoming sample needs to be added to the next incoming sample to achieve compensation for the fact that samples are too far apart in time.

If we had chosen a substantially lower center frequency and maintained the same sampling rate of 7200 samples per second then it would have been necessary to correlate non-adjacent samples. If, for example, a center frequency of 1170 Hz is chosen, then in addition to the compensation technique described, correlation between samples separated by two sampling intervals would be required.

Figure 4:
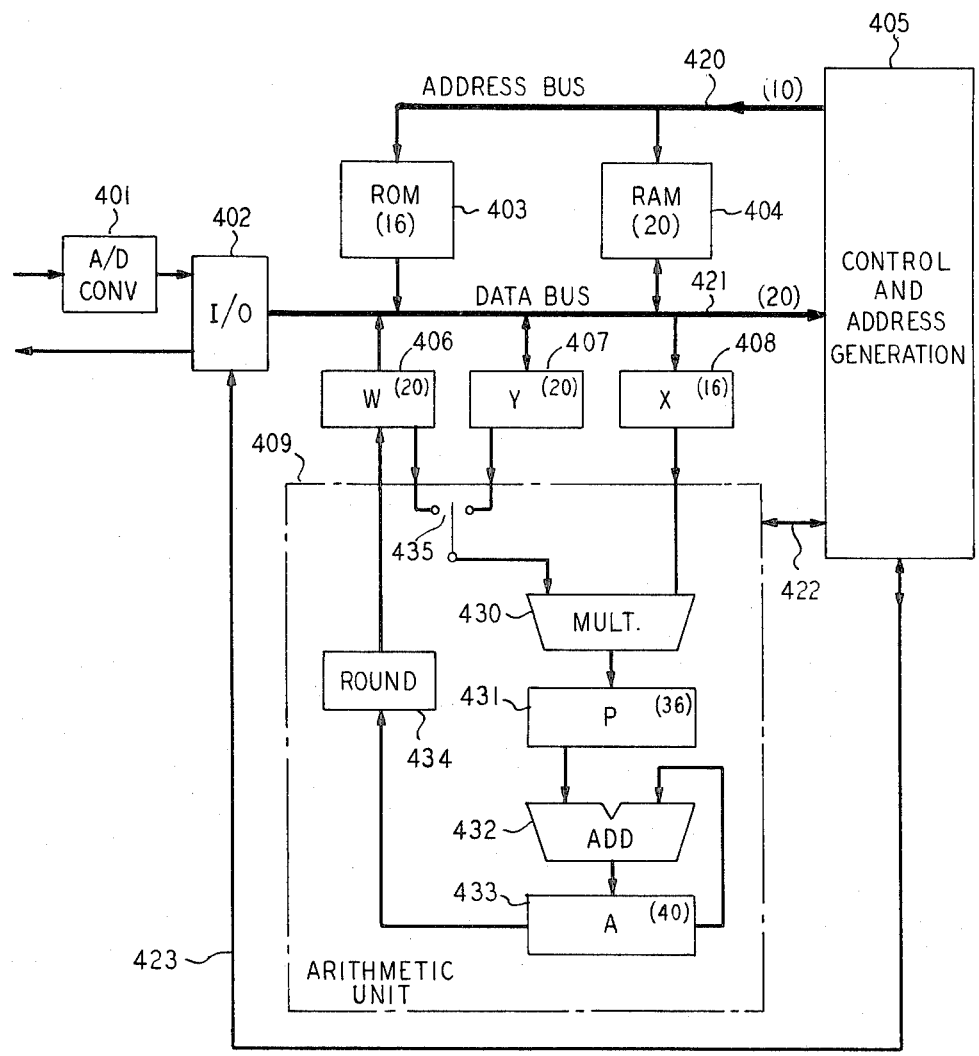
FIG. 4 discloses a general purpose digital signal processor capable of processing discrete samples of an incoming signal in accordance with this invention.

In a second embodiment of the invention, digital processing of pulse amplitude modulated samples is disclosed in the diagram of FIG. 4 which provides a block diagram of a processor having sufficient computational power to perform the necessary steps. Detailed circuits, such as clock distribution and a scheme for time shared use of the Data Bus, are not shown because the detail is considerable, not directly relevant to the invention, and believed to be well within the knowledge of persons having ordinary skill in the art of processor design. Further, a plurality of microprocessors are commercially available having different architectures that can accomplish the relatively simple computations required to implement the invention with very different details.

A general description of the required operations is set forth in the following steps:

(1) Sample the incoming signal at time $T_n$ and convert the sample (voltage level) into a binary signal-16 digit resolution is adequate.

(2) Store the binary signal in location $A_n$ of a Random Access Memory (RAM).

(3) Multiply the binary signal with scaling factor $a_0$ (scaling factors may be stored in a Read Only Memory) and store the product in location $B_n$ of the RAM.

(4) Multiply the binary representation with scaling factor $a_1$ and store the product in location $C_n$ of the RAM.

(5) Repeat steps 1-4 at time $T_{n+1}$ and store the results in location $A_{n+1}$, $B_{n+1}$ and $C_{n+1}$, respectively.

(6) Additively combine the contents of memory locations $B_{n+1}$ and $C_n$ and multiply the sum by the contents of memory location $A_{n+1}$ to generate each delay compensated sample.

In the above procedure it is noted that memory locations $A_n$, $B_n$ and $C_n$ may be reused and relabeled as $A_{n+2}$, $B_{n+2}$ and $C_{n+2}$ since the contents need not be saved for more than two iterations.

Returning to the diagram of FIG. 4, Analog to Digital converter 401 samples the incoming signal at a rate set by a predetermined clock signal. An example of a converter suitable for this purpose is disclosed in U.S. Pat. No. 4,200,863 which utilizes charge redistribution techniques to achieve A/D conversion. The incoming signal, thus encoded into binary digital form, is temporarily stored in Input/Output Buffer 402 until Control Unit 405 gates the stored data onto Data Bus 421 where it is transferred to Random Access Memory (RAM) 404 for later processing. RAM 404 is adapted to both read the contents of Data Bus 421 as well as write information onto it. The memory location in RAM 404 being exercised is selected by addressing data present on Address Bus 420. RAM 404 stores 20-bit words including sampled signal data and intermediate computational results.

Read Only Memory (ROM) 403 contains a plurality of 16-bit words comprising instructions and constants that may only be read onto Data Bus 421 from an internal memory location selected by addressing data present on Address Bus 420. The aforementioned coefficients $a_0$ and $a_1$ are stored in ROM 403 along with preprogrammed instructions for processing the input data in accordance with the invention.

Control Unit 405 is responsive to instructions from ROM 403 and converts these instructions in specific sequence for operations such as the determination as to which signals will be transferred between the various processing blocks shown in FIG. 4. Control Unit 405 sets up the various paths and assures that Data Bus 421 will not have more than a single source writing onto it at any one time.

Control Unit 405 generates the address destinations that define where in memory units 403 and 404 a particular word is to be stored or retrieved. Control Unit 405 also has the capability for arithmetic operations so that memory address modifications may be achieved simultaneous with, but without burden to, Arithmetic Unit 409.

X Register 408 and Y Register 407 hold inputs for Arithmetic Unit 409. The coefficients $a_0$ and $a_1$ are transmitted to Arithmetic Unit 409 through the X Register, and stored samples are transmitted through the Y Register. The W Register 406 holds the output of the Arithmetic Unit. The contents of W can be sent to Input/Output Register 402, stored in RAM 404, or returned to Arithmetic Unit 409 for use in the next calculation.

FIG. 2 is not only an analog embodiment of the invention but also may be treated as a computational flow diagram. With this perspective in mind, $V_1$ becomes a sampled signal $S(nT)$ and delay line 21 becomes a delay of T units (one sampling period).

Returning to FIG. 4, Arithmetic Unit 409 performs the multiplications and additions required to evaluate the computations set forth in the flow diagram of FIG. 2. Each multiplication by multiplier 430 is placed on completion in P (Product) register 431. Successive products may be added together by adder 432 and the result accumulated in A (Accumulator) Register 433. The product of the contents of the 16-bit X Register and the 20-bit Y or W Register produces up to 36 bits in the P Register. Accumulating these products may generate some "carries", so 40 bits are provided in the accumulator. When the accumulation is complete the contents of A Register 433 are transmitted to output W Register 406. Since W accommodates only 20 bits, the contents of the accumulator are rounded off in Unit 434 to make them fit into W. A transfer of data from A to W in the simplest case results in a truncation, that is, a portion of the 40 bit contents of the A register are simply dropped off. Other methods of rounding and truncation are clearly possible.

Switch 435 permits the contents of either Register W or Register Y to be selected as one of the inputs of multiplier 430. This switch, as well as the other Arithmetic Unit functions, are controlled by signals over line 422 from Control Unit 405.

The specific digital signal processor shown in FIG. 4 is, in fact, a general purpose device adapted to perform the specific computations required by the invention. It may further be programmed to perform a number of filtering functions such as low pass filtering as needed in the next step of the product demodulation process. The most favorable manner in which to implement the invention is clearly determined by the environment in which the invention will function. The simple calculations required, make the invention easily adaptable to numerous hardware or software implementations. Therefore, variations of the specific embodiment are possible within the spirit and scope of the invention.

What is claimed is:

1. Apparatus for correlating an input signal with a time delayed version of itself including means for additively combining a portion of the input signal with said delayed version to form a delay compensated signal; and means for multiplying said delay compensated signal with the input signal to generate an output signal.

2. Correlation apparatus according to claim 1 wherein the input signal is a frequency modulated sinusoidal waveform.

3. Correlation apparatus according to claim 1 wherein the input signal comprises periodic samples of a modulated waveform having a sinusoidal characteristic.

4. Correlation apparatus according to claim 3 wherein the delayed version of the input signal is generated by means for storing the periodic samples for a fixed time interval; and means for recovering the stored samples at the end of said fixed time interval.

5. In a method for demodulating a frequency modulated input signal including the steps of:
phase shifting the input signal by a fixed amount as measured at a predetermined frequency;
adding a portion of the input signal to the phase shifted signal to generate a phase compensated signal having substantially 90 degrees of phase shift at said predetermined frequency; and
correlating the phase compensated signal with the input signal to generate a signal having a time varying dc voltage in accordance with the frequency variations of the input signal.

6. A method for product demodulation of a modulated carrier wave having a sinusoidal character including the steps of:
sampling the amplitude of an incoming signal at periodic intervals;
encoding the amplitude of the samples into a plurality of binary digits;
storing the encoded samples for an interval of time;
multiplying certain encoded samples with a predetermined constant to provide amplitude scaling;
adding a presently received encoded sample with a previously received encoded sample to form a compensated sample-at least one of said samples being amplitude scaled;
multiplying the presently received encoded sample with the compensated sample to form a product demodulated signal.

7. Apparatus for forming a product between an input signal, having a sinusoidal characteristic, and a time delayed version of the input signal including means for delaying the input signal
characterized by:

means for additively combining the input signal with the delayed input signal to provide said time delayed version.

8. Apparatus according to claim 7 wherein said combining means further includes means for regulating the amplitude ratio of the input signal and the delayed input signal.

9. Apparatus according to claim 7 further including means for periodically sampling the input signal and encoding same into a plurality of binary digits representative of the amplitude of said sample.

10. Apparatus according to claim 9 wherein the means for delaying the input signal includes means for entering the binary encoded digits into a storage device and means for retrieving the stored binary encoded digits at a later time.

* * * * *